(12) United States Patent
Cavus et al.

(10) Patent No.: US 9,667,244 B1
(45) Date of Patent: May 30, 2017

(54) METHOD OF AND APPARATUS FOR BIASING SWITCHES

(71) Applicant: Analog Devices Global, Hamilton (BM)

(72) Inventors: Bilal Tarik Cavus, Istanbul (TR); Turusan Kolcuoglu, Istanbul (TR); Yusuf Alperen Atesal, Istanbul (TR)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/942,637

(22) Filed: Nov. 16, 2015

(51) Int. Cl.
| | | |
|---|---|---|
| *H03B 1/00* | (2006.01) | |
| *H03K 3/00* | (2006.01) | |
| *H03K 17/687* | (2006.01) | |

(52) U.S. Cl.
CPC .................. *H03K 17/687* (2013.01)

(58) Field of Classification Search
USPC ................................. 327/108–112
See application file for complete search history.

(56) References Cited

U.S. PATENT DOCUMENTS

| | | | | |
|---|---|---|---|---|
| 4,952,818 A * | 8/1990 | Erdelyi | ............ | H03K 19/01857 326/112 |
| 5,878,331 A | 3/1999 | Yamamoto et al. | | |
| 6,177,817 B1 * | 1/2001 | Fifield | .............. | H03K 19/00361 327/108 |
| 6,804,502 B2 | 10/2004 | Burgener et al. | | |
| 6,970,024 B1 * | 11/2005 | Reese | .............. | H03K 3/356113 327/112 |
| 7,263,337 B2 | 8/2007 | Struble | | |
| 7,613,442 B1 | 11/2009 | Kelly et al. | | |
| 8,159,282 B2 | 4/2012 | Katoh et al. | | |
| 8,368,462 B2 | 2/2013 | Sharma et al. | | |
| 8,373,490 B2 | 2/2013 | Burgener et al. | | |
| 8,400,205 B2 | 3/2013 | Foroudi | | |
| 8,421,438 B2 | 4/2013 | Pratt et al. | | |
| 8,493,128 B2 | 7/2013 | Adamski | | |
| 8,514,008 B2 | 8/2013 | Yan et al. | | |
| 8,547,156 B2 | 10/2013 | Foroudi | | |

(Continued)

FOREIGN PATENT DOCUMENTS

WO WO 2014047823 A1 4/2014

OTHER PUBLICATIONS

Peregrine Semiconductor, PE42020 Product Specification: UltraCMOS® True DC RF Switch, Dec. 2014, 25 pages, available at: www.psemi.com/pdf/datasheets/pe42020ds.pdf (accessed Nov. 2, 2015).

*Primary Examiner* — Adam Houston
(74) *Attorney, Agent, or Firm* — Knobbe Martens Olson & Bear LLP

(57) ABSTRACT

A control circuit is provided for controlling the voltage at the gate terminal of a field effect transistor acting as a switch. The voltage, at for example, the source terminal of the transistor can be provided to a low pass filter and is then voltage translated to provide the gate signal. The filtering can be arranged so as to compensate for the effect of parasitic capacitances within the transistor, thereby linearizing its frequency response. The voltage translation can help to limit voltage differences between the gate and channel of the transistor. This can be significant as relatively fast transistors, as might be used in microwave circuits, may fail with relatively modest voltages at their gates.

20 Claims, 10 Drawing Sheets

(56) References Cited

U.S. PATENT DOCUMENTS

| | | | |
|---|---|---|---|
| 8,854,111 B2 | 10/2014 | Chih-Sheng | |
| 9,054,726 B2* | 6/2015 | Okuda | H03M 1/124 |
| 9,312,909 B2 | 4/2016 | Kang et al. | |
| 9,374,124 B2 | 6/2016 | Kolcuoglu et al. | |
| 2002/0075044 A1* | 6/2002 | Hinterscher | H03K 19/00315 327/108 |
| 2007/0069798 A1 | 3/2007 | Kusachi | |
| 2007/0182461 A1* | 8/2007 | Harvey | H03K 19/0019 327/112 |
| 2011/0254614 A1 | 10/2011 | Huang et al. | |
| 2014/0062218 A1 | 3/2014 | Chih-sheng | |
| 2014/0062577 A1 | 3/2014 | Chih-sheng | |
| 2014/0070976 A1* | 3/2014 | Hurrell | G11C 27/02 341/172 |
| 2014/0144240 A1 | 5/2014 | Barlow et al. | |
| 2015/0145587 A1 | 5/2015 | Sigetani et al. | |

* cited by examiner

METHOD OF AND APPARATUS FOR BIASING SWITCHES

TECHNICAL FIELD

The present disclosure relates to a method of and apparatus for biasing transistor switches which, in use, may be exposed to a low frequency or direct current (DC) signal. The transistor switches may also pass high frequency components, such as a radio frequency (RF) or microwave signal. The transistor switch may be exposed to signals with relatively high power levels.

BACKGROUND

It is known to use electrically controlled switches, often formed by field effect transistors (FETs) to control the propagation of signals from one place to another.

The impedance of a FET is typically controlled by the gate to source voltage between its gate and source terminals. The gate voltage is often derived from a control circuit and is therefore often constrained to switch between two values corresponding to having the switch "on" and having the switch "off". As a result of this constraint, a variation in the DC voltage at the source terminal of the FET has the potential to modify the operation of the FET. It is typically undesirable that the state of the FET might be changed by the DC conditions at its signal inputs. Aspects of this disclosure relate to methods and apparatus for addressing this problem.

SUMMARY OF CERTAIN INVENTIVE ASPECTS

In accordance with a first aspect of this disclosure, a switch responsive to a switch control signal is disclosed. The switch comprises at least one stage, and preferably a plurality of stages connected in series. At least one and preferably at least two of the stages comprise a first signal terminal; a second signal terminal; and an electrically controllable impedance connected between the first and second signal terminals. The electrically controllable impedance is arranged to vary its impedance in response to a control signal provided to that stage. The stage further comprises a stage control circuit. The control circuit has a first control circuit input for receiving the stage control signal and a second control signal input operatively connected to either the first signal terminal or the second signal terminal of the stage. The stage control circuit is adapted to generate a control signal for the electrically controllable impedance as a function of the voltages at its first and second control circuit inputs.

Advantageously, the electrically controllable impedance in the stage (or each stage) can be a field effect transistor. Such transistors can exhibit rapid switching between high impedance and low impendence states. Advantageously, the stage control signal for the electrically controllable impendence comprises frequency components from a signal provided to either the first signal terminal or the second signal terminal of the stage, or of one of the stages. The components of that signal may be filtered into a desired frequency range. For example, the filter may be a low pass filter such that the components of the signal extend from DC to a first break point before becoming progressively attenuated after the break point. Preferably, the low pass filter break point frequency is selected based on knowledge of the sizes of the parasitic components associated with the electrically controllable impedance of the stage or stages, or of the filter response of a parasitic filter formed by the parasitic components and a resistance associated with the gate.

According to a second aspect of this disclosure, there is provided a method of controlling a switch, the method comprising forming a switch from a switch stage or a plurality of series connected switch stages, the or each switch stage including a respective field effect transistor connected between first and second signal terminals. The method further comprising modifying the frequency content of a control signal at the or each field effect transistor in order to compensate for parasitic components associated with the transistor and/or modifying the voltage at the control terminal of the transistor to take account of an instantaneous gate-source (or gate to channel) voltage difference at the transistor.

According to a third aspect of this disclosure, there is provided a control circuit for a field effect transistor switch. The control circuit includes a low pass filter that forms a filtered signal. The low pass filter has an input operatively connected to receive a signal from one side of the transistor switch. The filtered signal is used to create a variable signal that is provided to a control terminal of the field effect transistor switch.

BRIEF DESCRIPTION OF THE DRAWINGS

Embodiments of the present disclosure will be further described, by way of non-limiting example, in which.

DETAILED DESCRIPTION OF CERTAIN EMBODIMENTS

Figure 1:
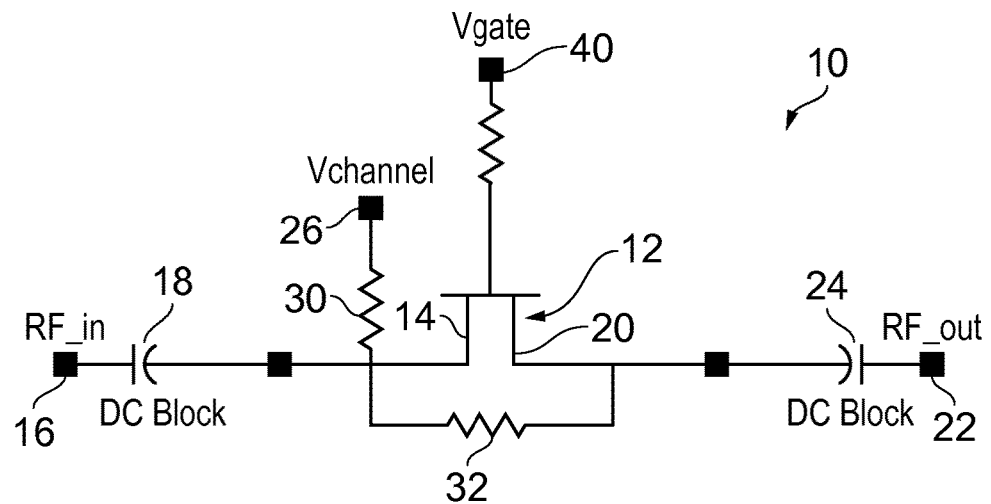
FIG. 1 illustrates a FET based switch having DC blocking capacitors.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

It is known that electrically controlled switches, generally formed from field effect transistors, can be used to selectively block or pass a signal. Many of these switches may be formed on an integrated circuit, either in respective reverse biased wells or as known to the person skilled in the art of silicon on insulator (SOI) fabrication in respective insulated wells.

However, as will be discussed in greater detail later, the voltage and frequency of the signal being handled by the transistor switch can cause loss of control of the transistor switch and may also risk device failure. This disclosure discusses ways to mitigate these issues.

The demands on the transistor used for a signal switch may mean that, in order to obtain transistors that are suitably fast, the transistor may suffer breakdown if the gate to channel voltage exceeds a relatively modest voltage difference. The voltage at which breakdown between the gate and channel of the transistor might occur may be comparable with the peak-to-peak signal amplitude that the transistor may be exposed to. The present disclosure enables the transistor gate voltage to track the voltage seen by the channel of the transistor, thereby allowing the risk of transistor breakdown to be addressed.

The ability to cause the gate voltage to track the channel voltage (which may be the voltage at the first signal terminal, the voltage at the second signal terminal or a voltage which is intermediate the voltages of the first and second signal terminals) also reduces signal induced changes in channel impedance in the transistor of a stage.

A known approach to gate voltage tracking relies on creating a high pass filter formed of a first capacitor (real or parasitic) between the source and the gate; a second capacitor (parasitic or real) between the drain and the gate; and a relatively high impedance resistor in series with the gate and an RF ground. Such an arrangement is shown in FIG. 11.

Figure 11:
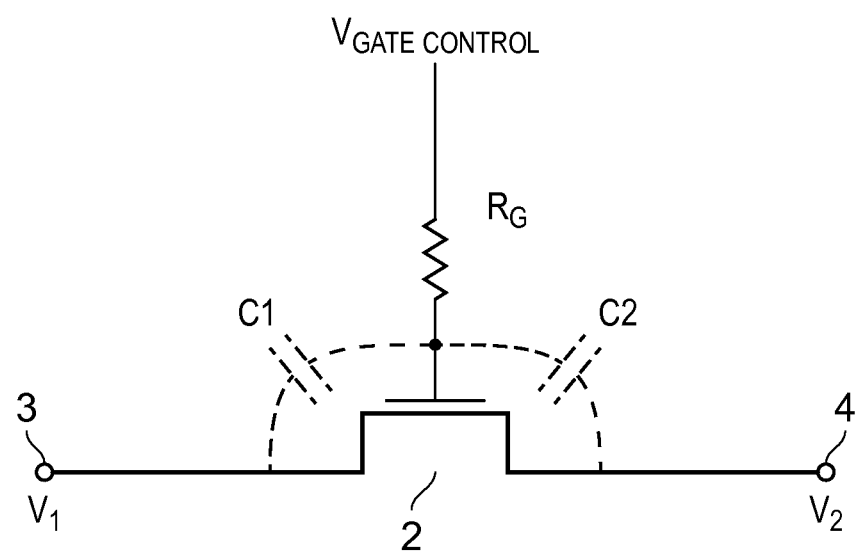
FIG. 11 shows a known boot strap circuit.

In FIG. 11, a transistor 2 is connected between two nodes 3 and 4 which represent signal terminals at voltages V1 and V2. If we assume that the transistor is passing a high frequency signal of angular frequency ω then the impedance of a capacitor $Z_C$ is $$Z_C = \frac{1}{j\omega c}$$

We can see that the capacitors act as a potential divider. If a DC or low frequency gate voltage $V_{GATE\ CONTROL}$ is applied via the series gate resistance $R_G$ then we create a bootstrap arrangement where the gate voltage is the sum of the voltage $V_{GATE\ CONTROL}$ and the voltage provided by the capacitive potential divider.

If the capacitive potential divider is formed of the parasitic capacitors associated with the transistor then it is reasonable to assume that C1=C2, and hence the gate voltage of the transistor 2 is $$V_G = V_{GATE\ CONTROL} + \frac{V_1 + V_2}{2}$$

This arrangement gives improved voltage handling of the switch at high frequencies.

However this approach does not work so well as the frequency drops and fails at DC.

The capacitance of the potential divider interacts with the impedance of the gate resistor $R_G$ to form a high pass filter. Near and below a cut-off frequency of the filter, the gate voltage becomes less good at tracking the source and drain voltages as the impedance of the capacitors increases with respect to that of the resistor $R_G$. As a consequence, the power handling and linearity of the switch degrades, because in the off state large signals have the potential to switch the switch on, and in the on state large signals may start to urge the switch to turn off.

The problem associated with the prior art approach could, in part, be mitigated by increasing the size of $R_G$. However a 1 mm transistor with parasitic capacitances C1 and C2 of 1 pF would result in $R_G$ to be more than 100 MOhm for operation at 1 KHz for certain applications. Resistors of this size are large on a wafer, and are not cost effective, nor does this approach work well at even lower frequencies or near DC (0 Hz).

A further disadvantage with this approach is that increasing the gate resistance increases the time to charge and discharge the parasitic capacitances in order to switch the transistor on or off. This means that device is relatively slow to respond to control signals.

From the above it can be seen that gate voltage tracking should be done carefully to avoid the tracking circuit becoming a source of distortion by introducing new signal propagation paths through the switch where the propagation paths have an impedance that varies with frequency, or where the tracking circuit introduces undesirable control delays.

The inventors realized that to obtain voltage tracking at low frequencies it is desirable to low pass filter the input signal, to create a low pass filtered signal which is then subjected to a first voltage translation process to provide a first stage control signal to switch the transistor switch to a conducting state and a second voltage translation process to form a second stage control signal to switch the transistor to a non-conducting state.

Preferably, care is taken to control the transition between the low frequency voltage tracking regime and the higher frequency voltage tracking regime to prevent unwanted gate voltage changes that might lead to distortion or transistor breakdown.

The first and second stage control signals may be provided to a multiplexer to select either of the first and second stage control signals for supply to the transistor switches.

FIG. 1 illustrates an alternating current (AC) coupled switch with bias terminals suitable for use in SOI circuits. The switch, generally designated 10, comprises a field effect transistor (FET) 12 having a gate, a source and a drain. The transistor 12 also has a "back gate," which is a connection to the body material of the device that can be biased to a lower voltage than the drain/source or connected to the gate (also known as the top gate). The back gate connection has been omitted for clarity. However, since a FET can be formed as a substantially symmetric device, then the distinction between drain and source may be less useful and it can be more helpful to think of controlling the device by virtue of its gate to channel voltage, where the channel is a region of semiconductor interconnecting first and second current flow terminals of the device, where one of these terminals can be regarded as being the drain and the other of these terminals can be regarded as being the source. This can be helpful when the transistor is on and hence the variation in voltage across the channel of a given transistor should be relatively modest. Thus, the transistor 12 can be regarded as having a first terminal 14 connected to an input node 16 (which can represent a signal terminal) by way of a DC blocking capacitor 18. Similarly, a second terminal 20 of the transistor 12 is connected to an output node 22 (which can represent a further signal terminal) by way of a DC blocking capacitor 24. First and second terminals 14 and 20 are biased to a channel voltage $V_{CHANNEL}$ provided by bias node 26. The bias node 26 is connected to the first and second current flow terminals 14 and 20 by way of resistances 30 and 32. The resistances 30 and 32 may be parasitic resistances and the node 26 may simply be a connection to the back gate of the FET 12.

Figure 2:
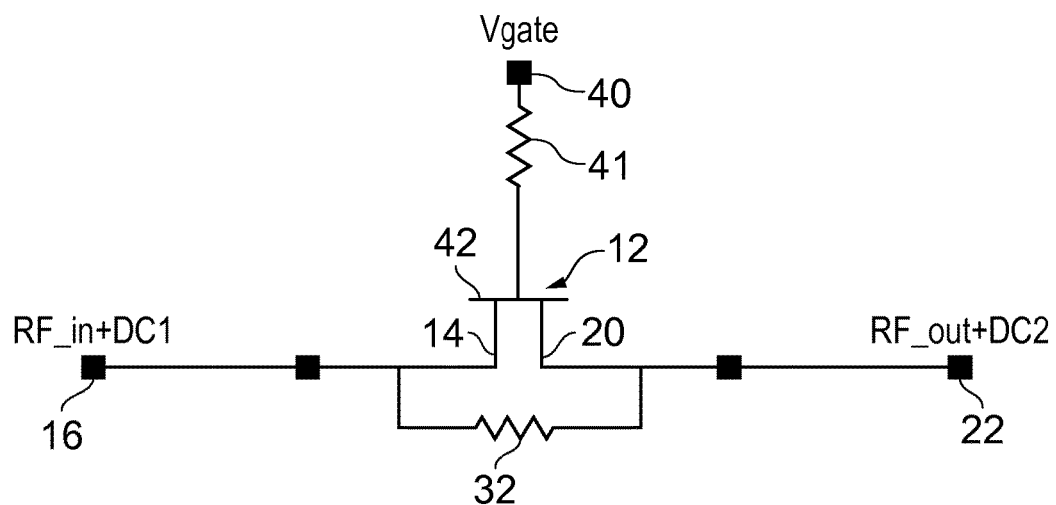
FIG. 2 illustrates an FET switch which is directly coupled between input and output terminals.

Usually $V_{CHANNEL}$ is biased to somewhere between the minimum and maximum supply voltages. Thus, if we take a case of an integrated circuit running on a supply that has $V_{DD}$ of +5 Volts and $V_{SS}$ of 0 Volts, then the channel may be biased to 2.5 Volts. If $V_{GATE}$ is provided to a control node 40 and switched between 5 Volts for on and 0 Volts for off, then we can see that the FET 12 will have a voltage from gate to source ($V_{GS}$) of 2.5 Volts for on and −2.5 Volts for off, assuming a threshold voltage between 0 and 0.5 Volts. This approach works well in terms of controlling the FET 12, but can have the disadvantage of including the DC blocking capacitors 18 and 24. The DC blocking capacitors 18 and 24 take up space, which itself may be significant, and also result in the switch 10 having a high pass filter characteristic, which means that lower frequency components may become attenuated, thereby giving rise to distortion if the signal contains low frequency components. Such a switch cannot work down to DC or near DC when the lower frequency components are attenuated. A way to overcome this is to remove the DC blocking capacitors 18 and 24 as shown in FIG. 2. Now the gate control signal provided at gate node 40 is provided to the gate 42 of the transistor 12. This removes the filter response provided by the capacitors 18 and 24, but now the voltage of the channel of the transistor 12 should no longer be well defined. Furthermore, if the load impedance at node 22 is relatively low, then the DC voltage at node 22 may differ from that at node 16 due to the Ohmic (channel) resistance of the transistor 12 in its on state. It also follows that these voltages have the potential to differ more significantly when the transistor 12 is non-conducting.

It might be thought that once the transistor 12 is conducting, then the DC voltages across the device would equalize. However, some systems are sufficiently highly powered that the transistor switch may drop a significant voltage, say one or more Volts between the input and the output nodes. Solutions to this problem will be discussed later.

For generality, the voltage at node 16 can be regarded as comprising an AC component $RF_{IN}$ and a DC or low frequency component DC1. The voltage at the output node 22 can be regarded as comprising an RF component $RF_{OUT}$ and a DC component DC2.

In order for the switch to work properly, the gate voltage should take account of the DC levels at the terminals 14 and 20. One approach to doing this is to modify the gate voltage to take account of the average voltage at the terminals 14 and 22. Thus, if we were intending for $V_{GS}$ on to be +2.5 Volts and $V_{GS}$ off to be −2.5 Volts as in the previous example, then we can see that:

In the on state, $V_{gate}=((DC1+DC2))/2)+2.5$ volts.
In the off state, $V_{gate}=((DC1+DC2))/2)-2.5$ volts.

An alternative approach would be to examine DC1 and DC2 to find the "worst case" voltage control of the transistor and then use that appropriately. Thus, in such a scheme then in the on state $V_{gate}=V_{max}+2.5$ volts, where Vmax is the larger of DC1 or DC2;

in the off state $V_{gate}=V_{min}-2.5$ volt, where Vmin equals the smallest of DC1 and DC2.

The "worst case" approach can work where the gate-to-channel breakdown voltage is much greater than the in-use input voltage that the switches may see. However, this is often not the case for transistor switches and hence this drive scheme could cause the device to fail.

In a realistic example of operation, the input signal may have an AC component $RF_{IN}$ which has a magnitude of around 10 Volts peak to peak and may have a DC offset of several Volts. The transistors used may not be able to stand the sum of the peak voltage, the DC offset and the gate control voltage required to hold the transistor in a desired state in certain applications. For example, to hold a transistor off where the input signal ranged between +5 V and −5 V, then the gate might need to be held at −8 V in certain applications. This gives a potential gate to channel difference of 13 V. However, the transistors used in microwave switching may have relatively thin gate to channel insulation, and breakdown may occur at gate to channel voltages of around 8 or 9 Volts.

Thus the arrangement of FIG. 2 may suffer breakdown.

The arrangement of FIG. 2 needs a transistor drive circuit that can address the problems of controlling the gate voltage and provide voltage tracking at low frequencies, as well as at higher frequencies.

Figure 3:
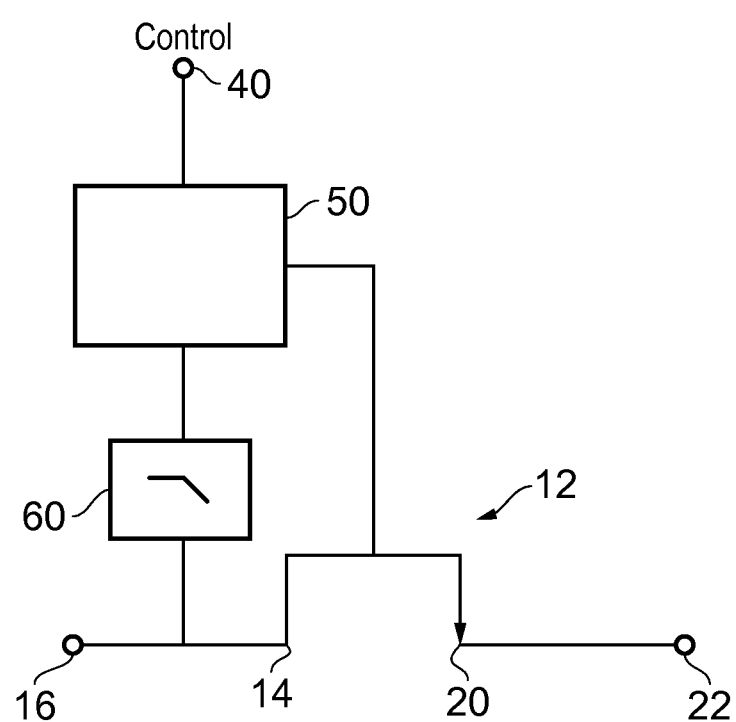
FIG. 3 schematically shows a control arrangement in accordance with the teachings of this disclosure to address some of the problems associated with the direct coupled switch of FIG. 2.

FIG. 3 shows an embodiment of the disclosure, which can be used to address the problems discussed with respect to the circuit of FIG. 2 and FIG. 11. The circuit of FIG. 3 differs from that of FIG. 2 in that the gate control voltage is no longer provided directly from the control node 40 to the gate 42 of the transistor (possibly by way of the intermediate resistor 41 shown in FIG. 2), but is now provided to a stage control circuit 50. The stage control circuit 50 generates a stage control voltage for the transistor 12 as a function of the switch control signal at the control node 40 and the voltage at one of the terminals 14 or 20. Furthermore the voltage from the selected terminal 14 or 20 may be filtered by a low pass filter 60. Which terminal is chosen can be a matter of design choice and as will be seen later it may be a matter of picking a side of the transistor 12 which is nearest the input or output node when the transistor in question is in a cascade of such switches forming a multistage switch. The control circuit 50 may serve to sum a control signal from the control node 40 with the low pass filtered voltage from node 16. Alternatively, the control circuit 50 may take the low pass filtered voltage from node 16/terminal 14 and create two intermediate voltages from that. Thus if the voltage at node 16 is represented by DC1, then the control circuit is arranged to generate intermediate voltages DC1+V1 and DC1−V2. V1 may equal V2. Either of these signals may then be selected by a multiplexer based on the control signal. This arrangement allows the gate signal to track with the voltage at one of the current flow (signal) control nodes 14 and 20 of the transistor 12.

Figure 4:
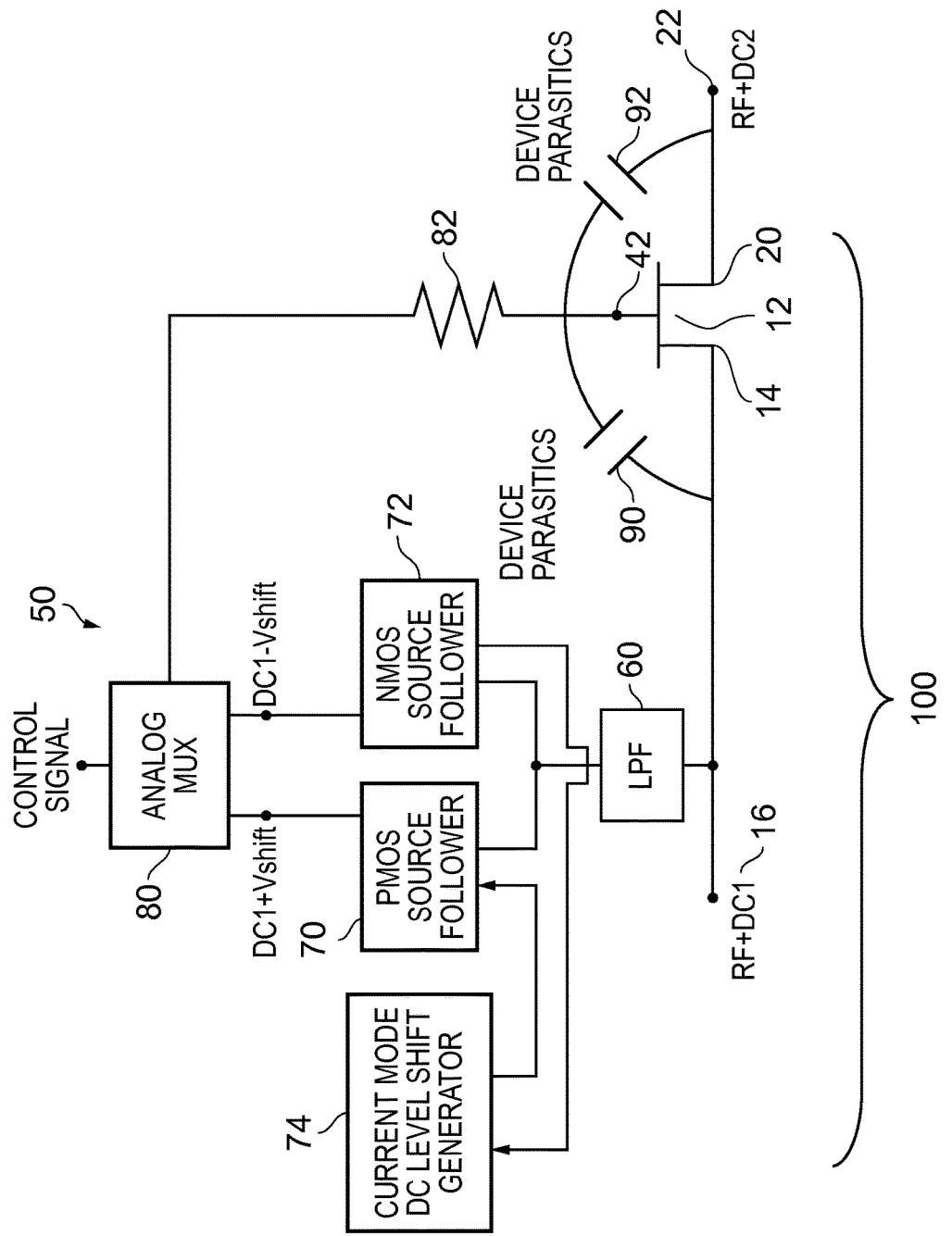
FIG. 4 shows an embodiment of this disclosure in greater detail.

FIG. 4 shows an embodiment of the present disclosure in greater detail. The control circuit 50 is connected to a low pass filter 60 which is connected, in this example, to the first terminal 14 of the transistor 12 so as to receive the signal $RF_{IN}+DC1$ from node 16. An output of the low pass filter 60 is provided to voltage generating circuits 70 and 72, which are arranged to create two output voltages, one corresponding to the value of $DC1+V_{SHIFT}$ and the other corresponding to the value $DC1-V_{SHIFT}$. The circuits 70 and 72 cooperate with a level shift generator 74 in order to achieve this function. As illustrated, the voltage generating circuit 70 can comprise a PMOS source follower and the voltage generating circuit 72 can comprise an NMOS source follower. The signals DC1+$V_{SHIFT}$ and DC1-$V_{SHIFT}$, which can be regarded as first and second intermediate signals, are provided to first and second inputs of an analog multiplexer 80, which selects one of them in response to the control signal, and provides the selected signal to the gate 42 of the transistor 12, optionally by way of intermediate resistance 82. The offset +$V_{SHIFT}$ and -$V_{SHIFT}$ need not have the same magnitude.

The effect of the low pass filter 60 is such that at low frequencies, corresponding to frequencies less than the low pass filter cut off frequency, the stage control circuit 50 acts much like a buffer, and passes a signal to the gate which tracks with the DC voltage and the frequency components less than the filter cut off frequency. At higher frequencies, such as frequencies higher than the low pass filter cut off frequency, the stage control circuit 50 can function as an averaging circuit and filters the RF signal out, thereby leaving substantially the DC component in the higher frequency range.

It can be seen that, at higher frequencies, the parasitic capacitors 90 and 92 in association with the resistor 82 form a high frequency voltage tracking circuit, as was discussed earlier. The high frequency voltage tracking circuit formed by the parasitic capacitances 90 and 92 can be augmented by the low frequency/DC tracking circuit to reduce and/or overcome the risk of signal induced breakdown, as was discussed earlier.

It is known to improve isolation between an input node and an output node by placing switches in series. As a result, the circuit shown in FIG. 4 may be regarded as forming a stage 100 which may be used as part of a multistage switch.

Figure 5:
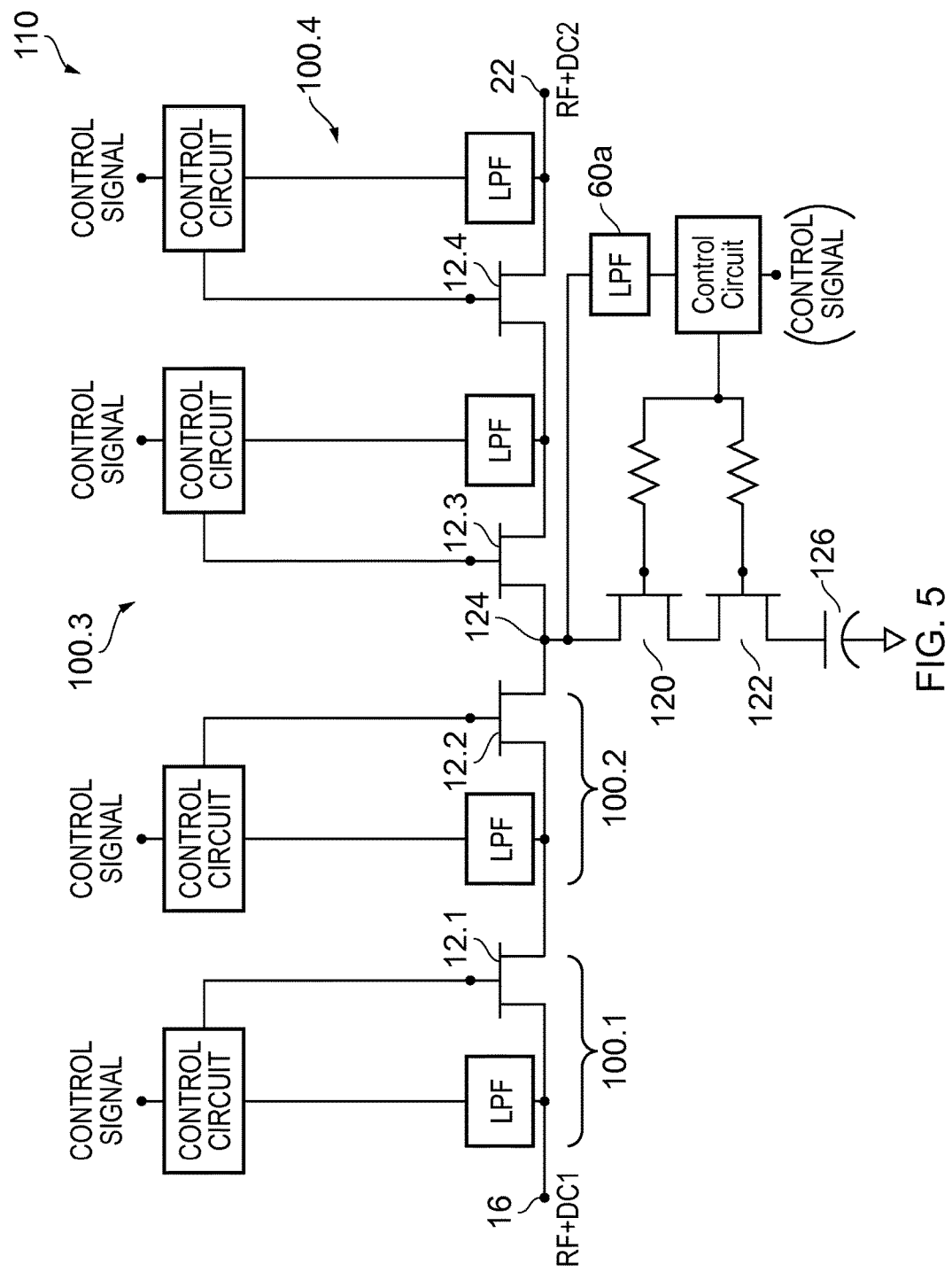
FIG. 5 shows a switch arrangement in accordance with this disclosure where the switch comprises a plurality of series connected stages.

FIG. 5 schematically illustrates a multistage switch, generally designated 110 comprising a plurality of stages, in this example four stages 100.1, 100.2, 100.3 and 100.4, arranged in series between nodes 16 and 22. Each of the stages can be switched between a high impedance state and a low impedance state in accordance with a switch control signal as described with respect to FIG. 4. The switch control signal can be shared between each of the stages and hence is a common control signal in the illustrated multistage switch 110. In order to improve isolation still further, one or more intermediate nodes between the stages may be provided and may be selectively connectable to signal ground by way of further FET switches. In this example shown in FIG. 5, two switches 120 and 122 are provided in series extending from an intermediate node 124 (formed between the second stage 100.2 and the third stage 100.3) to a small signal ground. The path to ground can be DC blocked by a blocking capacitor 126, if desired. Alternatively, since there should be no significant DC flow through the switches 120 and 122 when they are on, the DC blocking capacitor 126 may be omitted in order to save area within an integrated circuit. The number of transistors in a path from the intermediate node 124 to the ground can be varied at the circuit designer's choice. Having more transistors can improve the breakdown performance to ground, as can the inclusion of the DC blocking capacitor. However, the provision of the DC blocking capacitor 126 increases the circuit area on a semiconductor wafer, but this may be mitigated by simplifying the control circuit design for the transistors 120 and 122.

The transistors 120 and 122 are driven in anti-phase with the stages 100.1 to 100.4 and may be driven directly by logic signal or, as shown here, may be driven by a stage control circuit, similar or identical to that designated 50 in FIG. 4.

Use of the control circuit controls the gate to channel voltage to reduce breakdown. As the transistors 120 and 122 are not in the signal propagation path between the input 16 and the output 22 then their linearity when conducting is not so important, and the low pass filter 60a associated with them may be omitted to save space. As illustrated in FIG. 5, the transistors 120 are each FETs.

Figure 6:
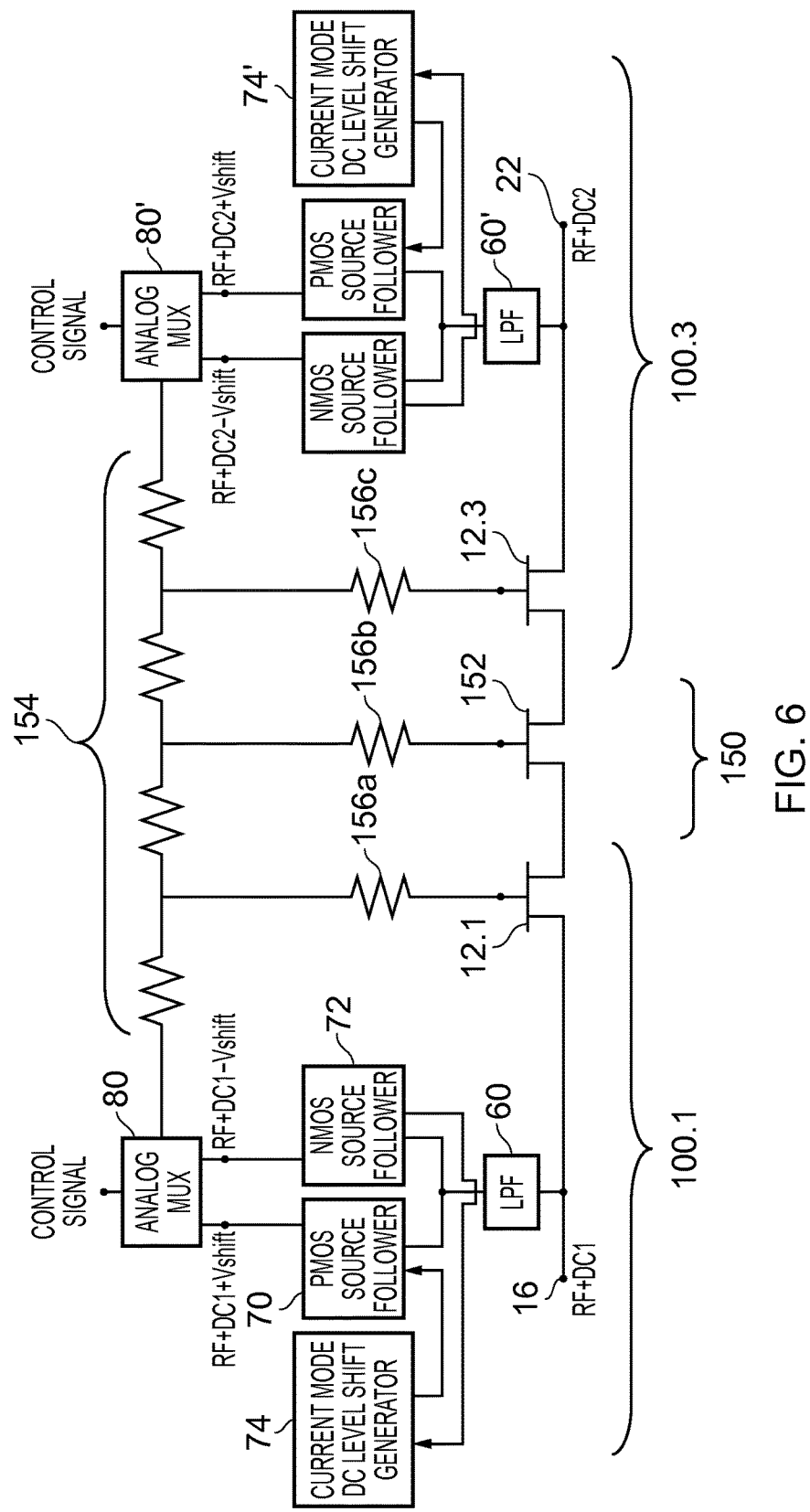
FIG. 6 shows a further arrangement in accordance with the teachings of this disclosure.

In the arrangement shown in FIG. 5, each stage comprises a respective transistor switch 12.1 to 12.4 and a control circuit. This may not be necessary. In a further embodiment, as shown in FIG. 6, the switch comprises more than two stages. FIG. 6 illustrates three stages, where the first stage 100.1 and a third stage 100.3 being of the type shown in FIG. 4. A second stage, designated 150 does not have its own control circuit, but instead takes the transistor control signals from, in this example, both the first and third stage control circuits and averages them to form a transistor control signal to be supplied to the FET 152. The arrangement shown in FIG. 6 may comprise further stages intermediate the stages 100.1 and 100.3 and may also include one or more signal grounding stages so as to improve isolation between nodes 16 and 22. The averaging may conveniently be done by way of a resistive voltage divider 154. In FIG. 6, each of the transistors has a gate resistor 156a to 156c associated with it. One or more of these resistors may be omitted. The resistors, in combination with the resistors of the potential divider and the output impendence of the multiplexer and level shifters, form a resistance that interacts with the parasitic capacitance of the gate of the transistor. This gives a low pass response, which the designer may wish to vary to interact in an appropriate way with the response of the low pass filter 60.

Figure 7:
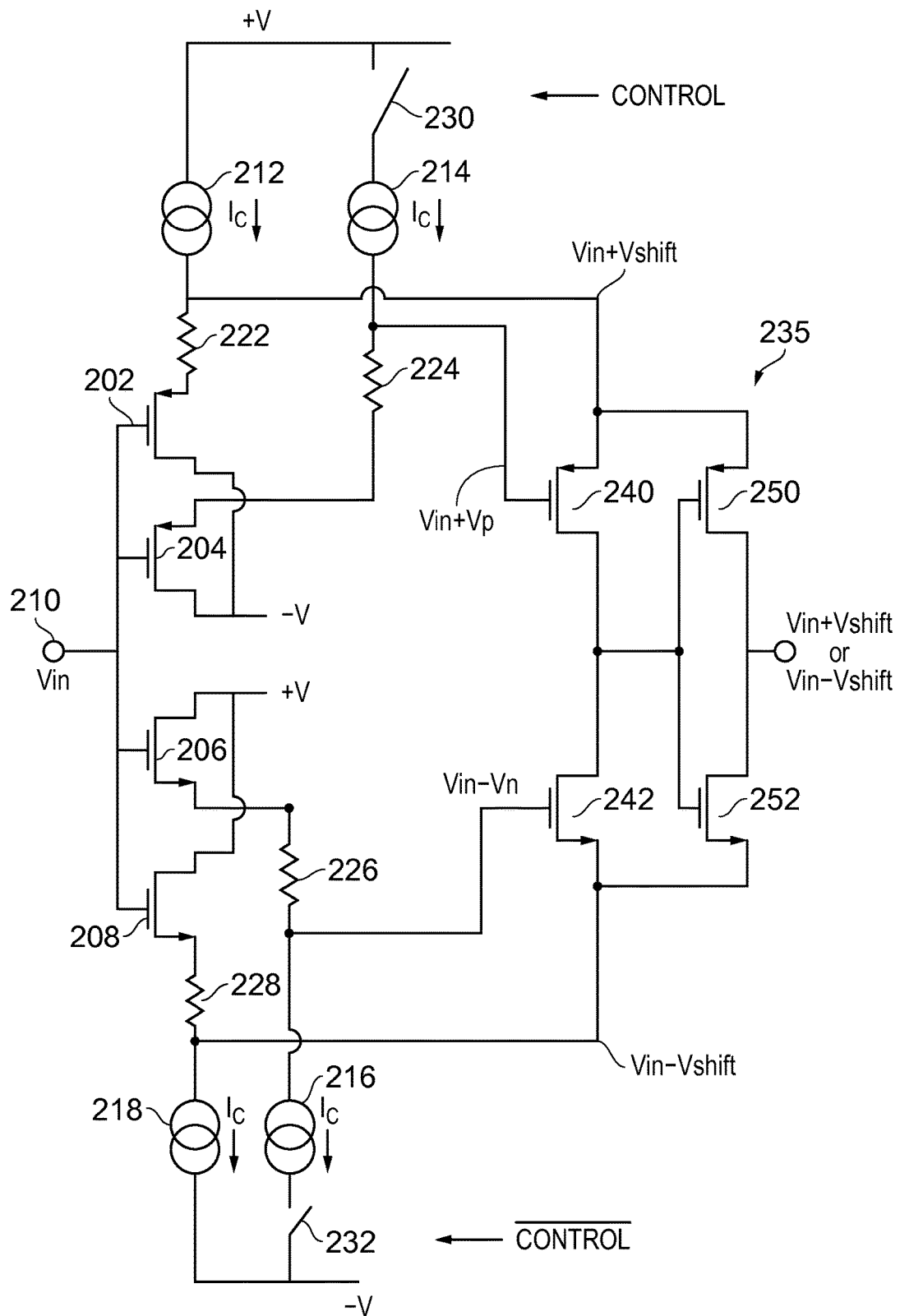
FIG. 7 is a circuit diagram of an embodiment of the control arrangement.

FIG. 7 schematically illustrates an example embodiment of the control circuit 50 in greater detail. The control circuit has, in this example, four input transistors 202, 204, 206, 208. Of these transistors illustrated in FIG. 7, the first two transistors 202 and 204 are P type devices whereas the third and fourth transistors 206 and 208 are N type devices. Each of the transistors has a respective gate connected to a common input node 210, which receives an input signal from the output of the low pass filter 60. Each transistor is associated with a respective current source 212, 214, 216 and 218. Each current source may advantageously, but not necessarily, be arranged to pass substantially the same current $I_C$. Each of the current sources may be implemented as a current mirror arranged to mirror the current flowing through a shared path. The current sources can be implemented by many configurations. The first current source 212 is connected to a first terminal of a first resistor 222. A second terminal of the resistor 222 is connected to the source of the first transistor 202. The second current source 214 is connected to the source of the second transistor 204 by way of a second resistor 224. Drains of the first and second transistors 202 and 204 are connected to a negative supply rail -V whereas the current sources 212 and 214 are connected to a positive supply rail +V, with the second current source 214 being in series with an electrically controlled switch 230. In breakdown critical applications, the drains of the first and second transistors 202 and 204 may be connected to other components, such as diodes or diode connected transistors to enhance reliability. The third and fourth transistors 206 and 208 are similarly configured, with the source of the third transistor 260 being connected to a terminal of a third resistor 226, which is in series with the third current source 216 and an electrically controlled switch 232. The source of the fourth transistor 208 is in series with a fourth resistor 228, which in turn is connected to the fourth current source 218. The current sources 216 and 218 are connected to the negative supply rail and the drains of the third and fourth transistors 206 and 208 are connected to the positive supply rail. Thus each of the transistors 202, 204, 206 and 208 effectively acts as a level shifter, with the degree to which they shift the voltage being determined by the size of their respective resistors and/or respective current source.

An output taken from the node between the first current source 212 and the first resistor 222 forms a first voltage $V_{IN}+V_{SHIFT}$. An output from a node formed between the second current source 214 and the second resistor 224 forms a voltage $V_{IN}+V_P$. An output from the node between the third resistor 226 and the third current source 216 forms a voltage $V_{IN}-V_P$ and an output from the node between the fourth resistor 228 and the fourth current source 218 forms the voltage $V_{IN}+V_{SHIFT}$. The switches 230 and 232 are driven in antiphase in response to a multiplexer control signal "control". Thus, when switch 230 is closed (conducting) switch 232 is non-conducting. Under these conditions $V_P = V_{SHIFT}$ and $V_N$ is less than $V_{SHIFT}$. When the multiplexer as defined by switches 230 and 232 is in its opposing state such that switch 230 is open and switch 232 is closed then $V_P$ is less than $V_{SHIFT}$ and $V_N$ is equal to $V_{SHIFT}$. The voltage $V_{IN}+V_{SHIFT}$ is used to act as the positive supply rail of an output stage, generally designated 235, whereas the voltage $V_{IN}-V_{SHIFT}$ is used to act as the negative supply rail of the output stage 235. The output stage comprises two pairs of stacked P type and N type transistors, each pair arranged in a pseudo-inverter configuration with the first pair of transistors 240 and 242 acting as an input for the second pair of transistors 250 and 252. This configuration can have several advantages. Firstly, the shifted voltages $V_{IN}+V_{SHIFT}$ and $V_{IN}-V_{SHIFT}$ which may be used to control the switching transistors are continuously generated. Thus there is no overhead in charging or discharging parasitic capacitors associated with the transistors 202 or 208 when it is desired to change the switching state of the switch. This contrasts with, for example, summing a control signal with the input voltage $V_{IN}$ in order to generate the gate voltage for the transistors. The approach used here gives rise to enhanced (faster) switching times. The inverter style multiplexer/output stage formed by the transistors 240, 242, 250 and 252 provides a relatively clean digital style switching action to switch between the two potential output voltages corresponding to $V_{IN}+V_{SHIFT}$ or $V_{IN}-V_{SHIFT}$. Additionally, the current mirrors and series resistors 222, 224, 226 and 228 enable the supply rail voltages to be dropped before they reach the input transistors 202, 204, 206 and 208 such that none of these transistors needs to experience a significant gate to channel voltage.

The use of the voltage follower configuration and the inverter style multiplexer means that the gate voltage can be actively pulled up or pulled down to the correct control voltage to control the stage transistor of an associated stage. Furthermore, because the connection is relatively direct, in that there are no deliberate intervening filters between the multiplexer output and the stage transistor, then there is little parasitic loading acting to inhibit the control voltage from the transistors from changing rapidly. As a result, changes resulting from changes to the input voltage are propagated through with their frequency response limited by the low pass filter 60. Changes to the switch state resulting from the control signal are propagated as rapidly as the series switches 230 and 232 can operate, which will be understood by the person skilled in the art will be very fast. Thus the switching of the stage control circuit 50 is highly responsive to its digital control signal and should not introduce switching delays as a result of modifying the transistor drive scheme to adapt the voltage at the gates of the transistors based on the voltages at the input or output of the switch circuit. This is particularly useful where the switch is arranged to respond quickly, for example, it itself is part of a multiplexer for other high speed signal routing system.

Figure 8:
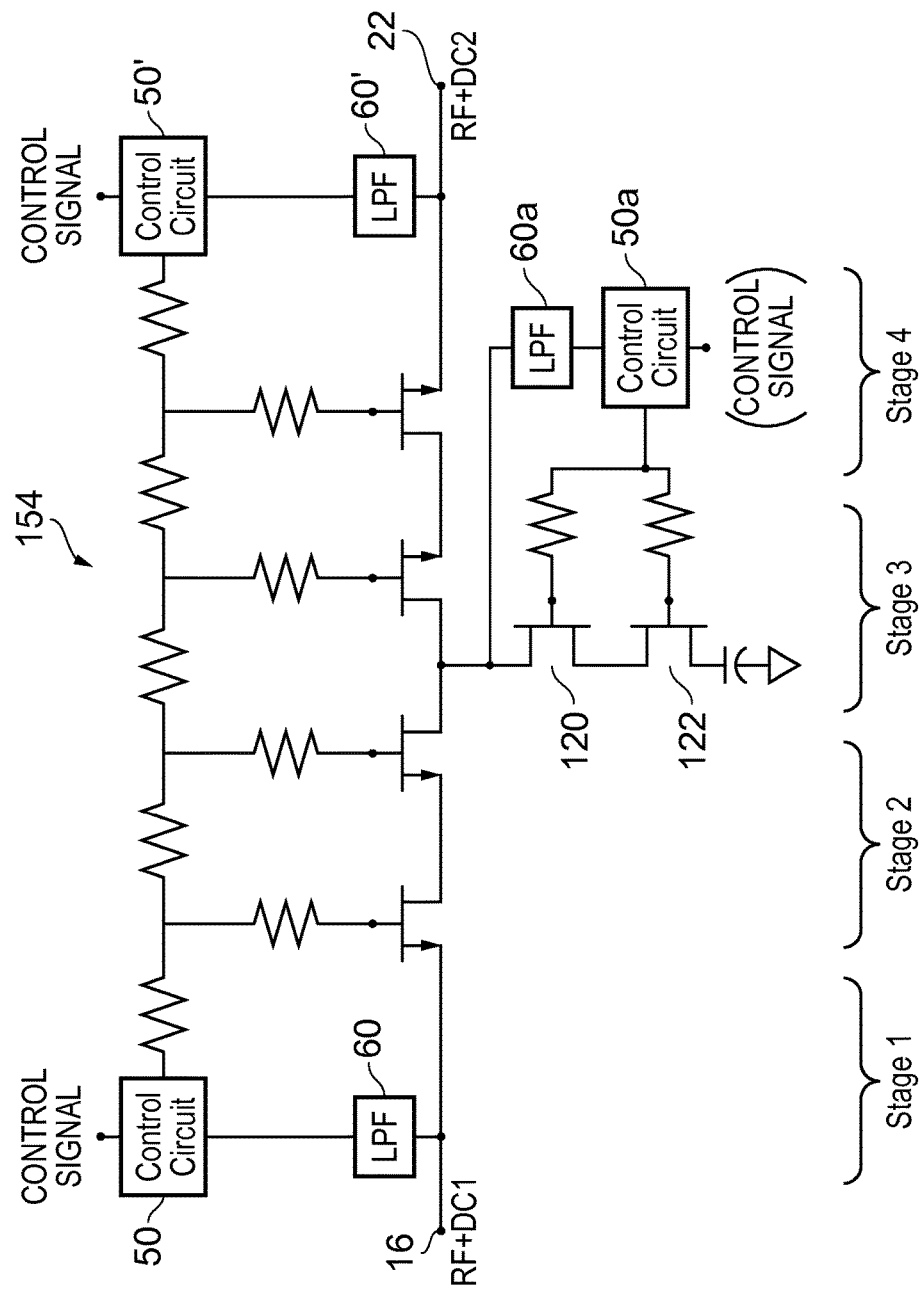
FIG. 8 is a circuit diagram of a further embodiment of a control circuit and switch in accordance with the teachings of this disclosure.

FIG. 8 shows modification to the arrangement shown in FIG. 6 where rather than having three stages in series between the terminals 16 and 22, four stages, designated stage 1 to stage 4 are provided. A control circuit 50 and low pass filter 60 are arranged to process the signal from the terminal 16 and the control circuit 50' and low pass filter 60' are arranged to process the signal at the second terminal 22. The illustrated circuit is symmetric, and thus either terminal 16 or 22 can at any given time act as the input with the other one acting as the output. The intermediate voltages derived by the control circuits 50 and 50' are then provided to the four field effect transistors, which are arranged in series between terminals 16 and 22, by way of a voltage divider 154. Each of these transistors also has a series resistor between its gate terminal and voltage divider 154. Additionally, in order to advance isolation, a shorting stage as hereinbefore described in respect to FIG. 5 and comprising transistors 120, 122 and a control circuit 50a is provided at a node between adjacent stages. For simplicity, and to maintain the symmetric nature of this circuit, the shorting stage is placed between the second stage and the third stage in the embodiment illustrated in FIG. 8. Additional shorting stages between other ends of the series connect stages may also be provided to enhance the isolation response of the switch if desired.

Figure 9:
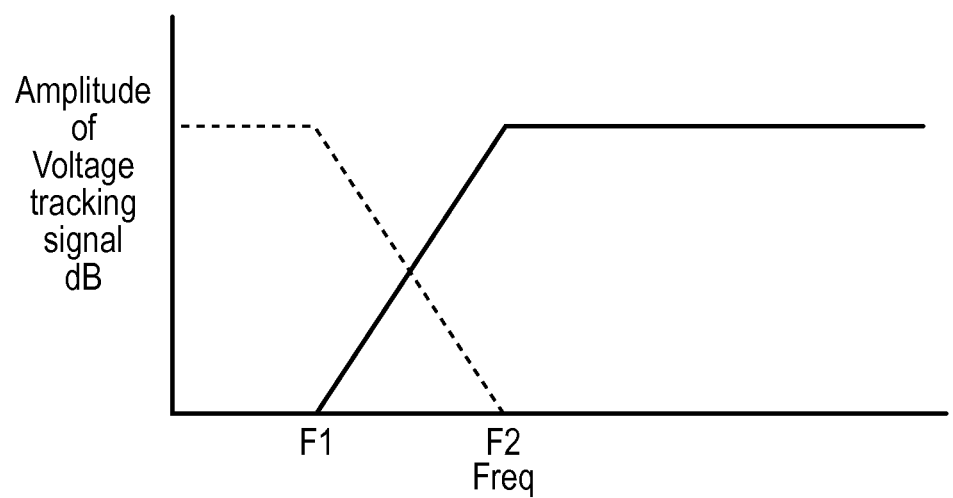
FIG. 9 is a plot of the relative frequency responses of the low pass filter and the frequency response of the transistor in the on state.

FIG. 9 schematically illustrates the relative sizes of the voltage tracking signals as a function of frequency of the signal applied to a signal input terminal of the switch. At low frequencies the voltage tracking signal is provided by way of the control circuit 50 and low pass filter 60. This applies from DC to a first frequency F1, and then the amplitude of the voltage tracking component of the gate signal supplied via this path starts to reduce.

However the first frequency F1 is selected, based on the knowledge of the breakpoint of the bootstrap circuit (as discussed with respect to FIG. 11) such that the voltage tracking signal via the bootstrap path starts to become significant, and such that the sum of the voltage tracking signals at the gate of the switch is substantially constant (assuming the input amplitude remains constant) over a wide frequency range.

Should the designer so wish, they could modify the frequency response, for example by making the low pass filter 60 and/or 60' programmable. This gives the designer an option to provide a switch, which may be provided in an integrated circuit package, which can accommodate variations between switches, for example process variations.

Figure 10:
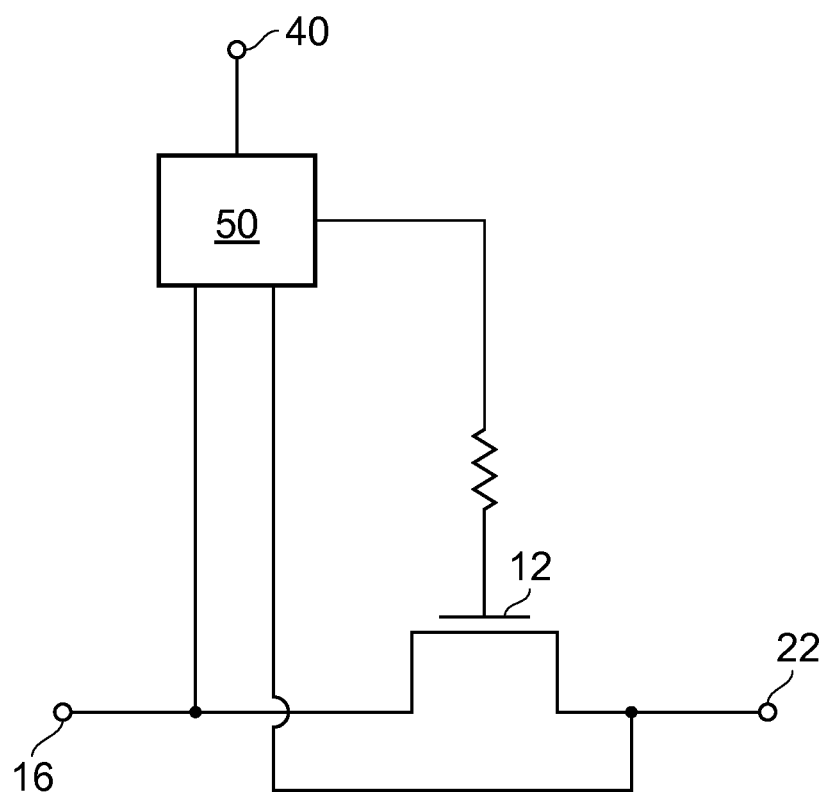
FIG. 10 is a schematic diagram of a further embodiment of this disclosure.

In some embodiments a single transistor 12 may provide the desired switching capability. In such circumstances the circuit shown in FIG. 3 may be used. However, it may be desirable to modify the circuit of FIG. 3 to be responsive to the voltage on either side of the switch 12, as shown in FIG. 10. This may be achieved, for example, by providing a low pass filter 60 (not shown in FIG. 10) connected to either side (or both sides) of the switch, and then summing or averaging the outputs, for example by way of a resistive divider or respective voltage to current converters, summing the currents and converting back to the voltage domain, depending on the amount of isolation needed across the switch. The principles and advantages discussed with reference to FIG.

10 can be implemented in connection with any of the other embodiments discussed herein.

Alternatively, two circuits 50 could be provided and their output averaged by a potential divider—much like the arrangement shown in FIG. 6 but with the first and third transistors omitted.

It is thus possible to create an improved multistage switch.

The claims presented herein are in single dependency format suitable for filing at the USPTO. However, for the avoidance of doubt, it is to be understood that each one of these claims is intended to be multiply dependent on any preceding claim of the same type, except where that is clearly infeasible.

Aspects of this disclosure can be implemented in various electronic devices. Examples of the electronic devices can include, but are not limited to, consumer electronic products, parts of the electronic products such as packaged switch components, electronic test equipment, cellular communications infrastructure, etc. Examples of the electronic devices can include, but are not limited to, precision instruments, medical devices, wireless devices, a mobile phone such as a smart phone, a telephone, a television, a computer monitor, a computer, a modem, a hand-held computer, a laptop computer, a tablet computer, a wearable computing device such as a smart watch, a personal digital assistant (PDA), a vehicular electronics system, a microwave, a refrigerator, a vehicular electronics system such as automotive electronics system, a stereo system, a DVD player, a CD player, a digital music player such as an MP3 player, a radio, a camcorder, a camera, a digital camera, a portable memory chip, a washer, a dryer, a washer/dryer, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A switch responsive to a switch control signal, the switch comprising one or more stages, at least a first one of the stages comprises:
    a first signal terminal;
    a second signal terminal;
    an electrically controllable impedance connected between the first and second signal terminals, the electrically controllable impedance arranged to vary its impedance in response to a stage control signal; and
    a stage control circuit having a first control circuit input configured to receive a switch control signal;
    where the stage control circuit has a second control circuit input responsive to a signal voltage at either the first signal terminal or the second signal terminal, a low pass filter is provided in a path of the signal voltage, and the stage control circuit is adapted to generate the stage control signal as function of voltage at the first and second control circuit inputs.

2. A switch as claimed in claim 1, where the switch comprises a plurality of stages connected in series, wherein a second stage of the plurality of stages comprises a second electrically controllable impedance and a second stage control circuit.

3. A switch as claimed in claim 1, where an input of the low pass filter is operatively connected to one of the first and second signal terminals, and an output of the low pass filter is operatively connected to the second control circuit input.

4. A switch as claimed in claim 3, where a break point in the low pass filter response of the low pass filter is selected based on a high pass frequency response of the electrically controllable impedance between the first and second signal terminals.

5. A switch as claimed in claim 3, in which a voltage output by the low pass filter is voltage translated to form the stage control signal.

6. A switch as claimed in claim 5, in which the voltage output by the low pass filter is voltage translated by a first voltage translator to form a first intermediate signal corresponding to a signal level of the stage control signal to make the switch conducting.

7. A switch as claimed in claim 6, in which the voltage output by the low pass filter is voltage translated by a second voltage translator to form a second intermediate signal corresponding to a signal level of the stage control signal to cause the switch to inhibit signal flow between the first and second signal terminals.

8. A switch as claimed in claim 7, further comprising a selector configured to output one of the first and second intermediate signals as the stage control signal in response to the switch control signal.

9. A switch as claimed in claim 1, wherein the electrically controlled impedance of the at least one stage comprises a field effect transistor.

10. A switch as claimed in claim 1, wherein the one or more stages comprise two stages each having a respective stage control circuit, the outputs of the stage control circuits of the two stages being provided to a differencing circuit arranged to form at least one further control signal having a value between the outputs of the stage control circuits of the two stages, the at least one further control signal being provided to at least one further stage of the one or more stages connected intermediate the two stages having the stage control circuits.

11. A switch as claimed in claim 10, where the differencing circuit comprises a potential divider.

12. A switch as claimed in claim 2, in which the first one of the plurality of stages is connected to a input of the switch or to a first input/output terminal of the switch, and the second one of the plurality stages is connected to an output of the switch or to a second input/output terminal of the switch, and the first stage has a first low pass filter connected to the input of the switch or to the first input/output terminal of the switch, and the second stage has a second low pass filter connected to the output of the switch or to the second input/output terminal of the switch.

13. A switch as claimed in claim 2, further including a circuit configured to short a signal path to ground in response to a control signal.

14. A control circuit for a switch, the control circuit comprising a low pass filter configured to receive a signal from a first side of the switch to form a low pass filtered version of a voltage at the first side of the switch, and a signal generation circuit configured to generate a variable signal to be provided to at least one field effect transistor forming the switch, where the variable signal varies in response to an output of the low pass filter.

15. A control circuit as claimed in claim 14, in which the variable signal substantially tracks the voltage at the first side of the switch subject to an offset, and where the polarity of the offset is selected in response to a digital control signal.

16. A control circuit for a switch as claimed in claim 14, further comprising a second low pass filter for receiving a signal from a second side of the switch to form a low pass filtered version of a voltage at the second side of the switch and a second signal generation circuit configured to generate a second variable signal, and an averaging circuit configured to form at least one transistor drive signal as a weighted average of the first and second variable signals.

17. A control circuit as claimed in claim 14, in which the low pass filter is adjustable.

18. A switch comprising the at least one field effect transistor in current flow communication with first and second terminals of the switch, and a control circuit as claimed in claim 14, for controlling the at least one field effect transistor.

19. A method of controlling a switch, where the switch is formed from a plurality of series connected stages, each stage of the series connected stages comprising a respective transistor connected between first and second terminals, the method comprising modifying the frequency content of a control signal provided to the transistor in order to compensate for parasitic components associated with the transistor.

20. A method of controlling a switch as claimed in claim 19, further comprising modifying an instantaneous control voltage at the transistor to maintain the voltage between a gate of the transistor and its channel outside of a breakdown voltage region.

* * * * *